United States Patent
Majarov et al.

(10) Patent No.: US 8,913,352 B2
(45) Date of Patent: Dec. 16, 2014

(54) METHOD AND APPARATUS FOR DETECTING A DESATURATION FAULT IN AN INVERTER MODULE

(71) Applicant: GM Global Technology Operations LLC, Detroit, MI (US)

(72) Inventors: Konstantin S. Majarov, Torrance, CA (US); David Tang, Rancho Cucamonga, CA (US); Reynaldo Arturo Suazo Zepeda, Redondo Beach, CA (US); Nitinkumar R. Patel, Cypress, CA (US); Daniel L. Kowalewski, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 140 days.

(21) Appl. No.: 13/756,645

(22) Filed: Feb. 1, 2013

(65) Prior Publication Data
US 2014/0218826 A1 Aug. 7, 2014

(51) Int. Cl.
*H02H 7/122* (2006.01)
*H02K 11/00* (2006.01)

(52) U.S. Cl.
CPC ........... *H02K 11/0052* (2013.01); *H02H 7/122* (2013.01)

USPC .......................................................... 361/18

(58) Field of Classification Search
CPC ........................... H02K 11/0052; H02H 7/122
USPC .......................................................... 361/18
See application file for complete search history.

(56) References Cited

U.S. PATENT DOCUMENTS

| | | | |
|---|---|---|---|
| 6,097,582 A * | 8/2000 | John et al. ........................ | 361/79 |
| 2004/0034508 A1* | 2/2004 | Cheng et al. ................... | 702/185 |
| 2004/0120090 A1* | 6/2004 | Galli et al. ..................... | 361/115 |
| 2005/0281065 A1* | 12/2005 | Nojima ........................... | 363/98 |
| 2013/0155551 A1* | 6/2013 | Grbovic ........................... | 361/18 |

OTHER PUBLICATIONS

U.S. Appl. No. 13/170,428, Wang, et al.

* cited by examiner

*Primary Examiner* — Scott Bauer

(57) ABSTRACT

A method for monitoring an inverter module for a multi-phase electric motor/generator includes deactivating operation of the inverter module, monitoring voltage on a high-voltage bus configured to supply electric power to the inverter module, detecting occurrence of a true fault when a change in the voltage on the high-voltage bus is greater than a predetermined threshold, and detecting occurrence of a false fault when the change in the voltage on the high-voltage bus is less than the predetermined threshold.

17 Claims, 3 Drawing Sheets

US 8,913,352 B2

METHOD AND APPARATUS FOR DETECTING A DESATURATION FAULT IN AN INVERTER MODULE

TECHNICAL FIELD

This disclosure is related to inverter modules for electric motor/generators.

BACKGROUND

The statements in this section merely provide background information related to the present disclosure. Accordingly, such statements are not intended to constitute an admission of prior art.

Inverters employ power switches, e.g., insulated gate-drive bipolar transistors (IGBTs) or MOSFETs to convert high-voltage DC electrical power to high-voltage AC power that is transferred to an electric motor/generator to generate torque for tractive effort in vehicles employing hybrid-drive and electric-drive powertrain systems. Faults in such systems include line-to-line electric shorts, ground faults, and shoot-through conditions in the power switches of the inverter, the electric motor/generator, and a multi-phase power bus electrically connected between the inverter and the electric motor/generator. Faults associated with power switches and windings of the electric motor/generator may result in excess electric current flow through the various components, and an increased voltage magnitude across a collector and emitter of one or more of the power switches, referred to as desaturation. One known fault mode is a shoot-through condition, wherein upper and lower switches in the same inverter leg are switched ON at the same time. This condition causes a shoot-through condition wherein the DC bus is shorted. This condition produces a voltage dip on the DC bus.

Known power switches are controlled to one of an ON condition and an OFF condition. When in the ON condition with the power switch functioning as designed, electric current through the power switch is saturated, i.e., all available current passes through the switch with a small portion dissipating into heat energy due to switch resistance. When in the OFF condition, the switch blocks flow of electric current.

A desaturation fault in a power switch can cause electric current to increase beyond a maximum operating limit, wherein the power switch enters a linear mode, thus desaturating the power switch (DSAT). A DSAT condition is said to exist when the voltage magnitude across a collector and emitter (Vce) of a power switch rises above a threshold, e.g., 1-2 volts when a gate-emitter voltage is high. Known control system responses to a DSAT fault include an immediate shutdown of the electric motor/generator. Known systems are configured to monitor power switch collector-emitter voltages to detect DSAT faults, and include control systems to effect an immediate shutdown of the electric motor/generator upon detection of a DSAT fault. Powertrain systems are exposed to external disturbances including electromagnetic interference (EMI) that may trigger false detection of a fault and an associated immediate shutdown of the electric motor/generator that is unnecessary.

Known DSAT diagnostic methods involve employing a hardware circuit to monitor electric parameters and executing remedial action designed to protect hardware and systems from electrical or heat damage. One known method of monitoring to protect against DSAT faults includes measuring a voltage drop between a collector and an emitter on each power switch. Known hardware-based DSAT diagnostics are designed to respond quickly to a perceived fault, but require circuitry that must be designed and implemented during system development when system properties are not all known. Therefore hardware-based diagnostics can suffer from false-positive fault triggers due to hardware circuitry production tolerance variations and unexpected system events. Due to hardware imperfections and tolerance stack-up issues, hardware-based DSAT diagnostics may produce a false-positive DSAT signal leading to unnecessary shutdown of the electric motor/generator. A known method of compensating for issues associated with hardware-based DSAT diagnostics includes employing diagnostic software that includes a retry routine wherein a first hardware diagnostic trip does not trigger a system wide shutdown. Known retry routines clear or erase faults detected by the hardware-based diagnostics and allow the system to restart a calibratable number of times using a retry counter. The quantity of retries for the hardware-based diagnostic can be a predetermined fixed value. This fixed quantity of retries creates a protection from nuisance trips, but can create an overstress condition for hardware when a real fault is present.

SUMMARY

A multi-phase electric motor/generator is coupled to an inverter module. In response to a preliminary fault in the inverter module being indicated by a hardware-based desaturation diagnostic scheme, the inverter module is deactivated and voltage on a high-voltage bus configured to supply electric power to the inverter module is monitored. Occurrence of a true fault is detected when a change in the voltage on the high-voltage bus is greater than a predetermined threshold. Occurrence of a false fault is detected when the change in the voltage on the high-voltage bus is less than the predetermined threshold.

BRIEF DESCRIPTION OF THE DRAWINGS

One or more embodiments will now be described, by way of example, with reference to the accompanying drawings, in which:

FIG. 2-1 illustrates a fault validation scheme to monitor, detect and validate desaturation (DSAT) faults in one of the power switches of an inverter module for a multi-phase electric motor/generator, in accordance with the disclosure;

FIG. 2-2 illustrates additional details of an embodiment of the fault validation scheme of FIG. 2-1 including execution of a fault counter scheme, in accordance with the disclosure;

DETAILED DESCRIPTION

Figure 1:
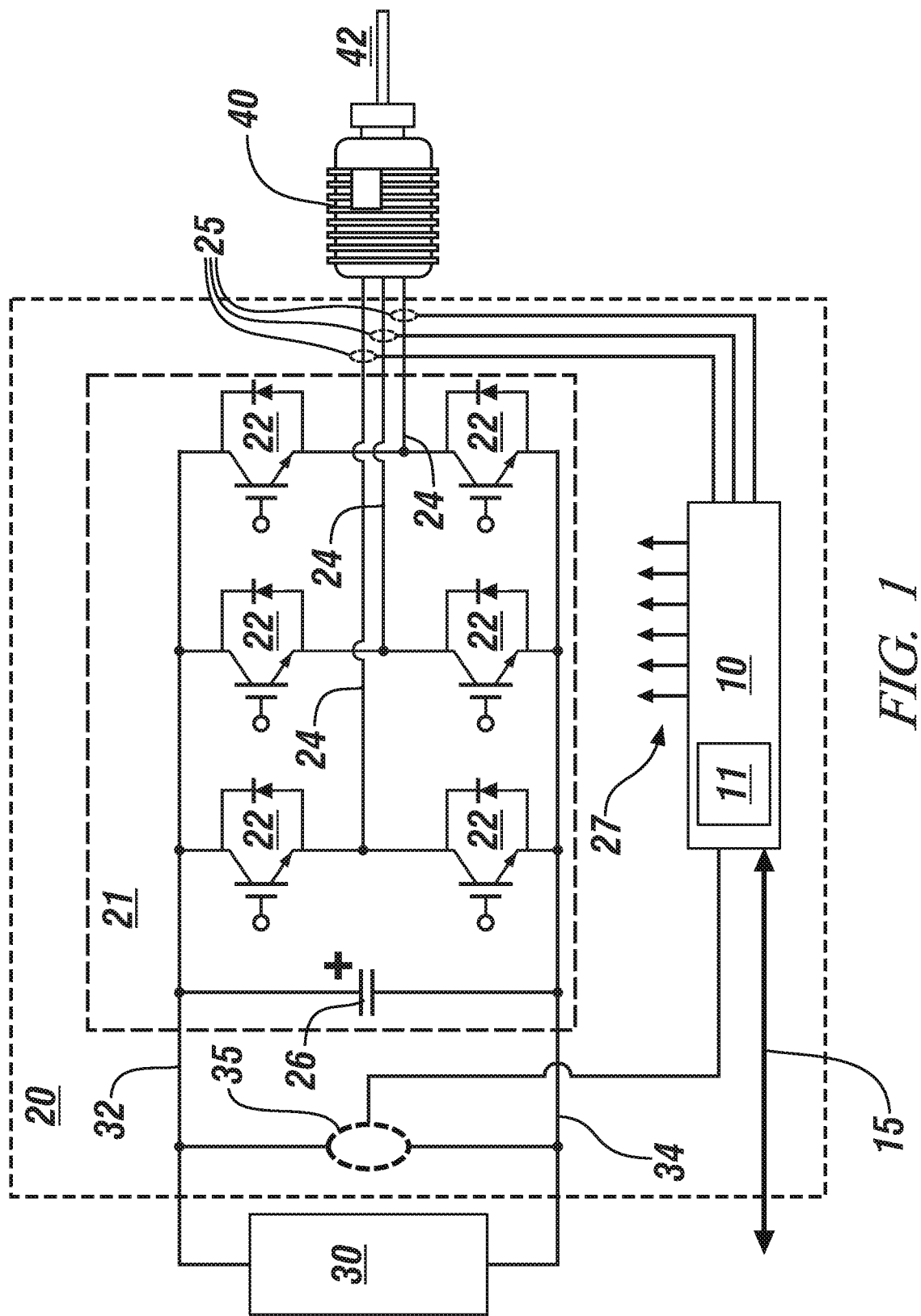
FIG. 1 illustrates an electric system for a multi-phase electric motor/generator including a high-voltage battery, an inverter module, and a controller, in accordance with the disclosure.

Referring now to the drawings, wherein the showings are for the purpose of illustrating certain exemplary embodiments only and not for the purpose of limiting the same, FIG. 1 schematically illustrates an electric system for a multi-phase electric motor/generator 40. The system includes a high-voltage battery 30, an inverter module 20, and a controller 10. The electric motor/generator 40 includes an output member 42 for transferring torque, e.g., tractive torque for a vehicle system, or for other systems without limitation. The system includes a high-voltage bus including a positive bus 32 and a negative bus 34 that electrically connects the battery 30 to the inverter module 20. The inverter module 20 preferably includes controller 10, a voltage sensor 35, and a switch module 21 in one embodiment. The voltage sensor 35 monitors electrical potential between the positive bus 32 and the negative bus 34, and signally connects to the controller 10. The switch module 21 preferably includes a bus capacitor 26 and a plurality of high-voltage switches 22, e.g., IGBTs that interconnect to phases or legs of the electric motor/generator 30 via corresponding electric lines 24. Each high-voltage switch 22 includes an internal monitoring circuit that measures voltage across a collector/emitter junction (Vce) and is configured to detect a hardware fault when Vce is greater than a threshold. The controller 10 operatively connects to each of the high-voltage switches 22 via signal lines 27 to control activation and deactivation thereof, and signally connects to each of the high-voltage switches 22 to monitor and detect presence of hardware faults. Current sensors 25 are employed to monitor current through each of the electric lines 24. The current sensors 25 signally connect to the controller 10. The controller 10 includes a plurality of control routines 11. The controller 10 preferably signally connects via a communications bus 15 to other systems and controllers within a system that employs the electric motor/generator 40.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

Figures 1, 2:
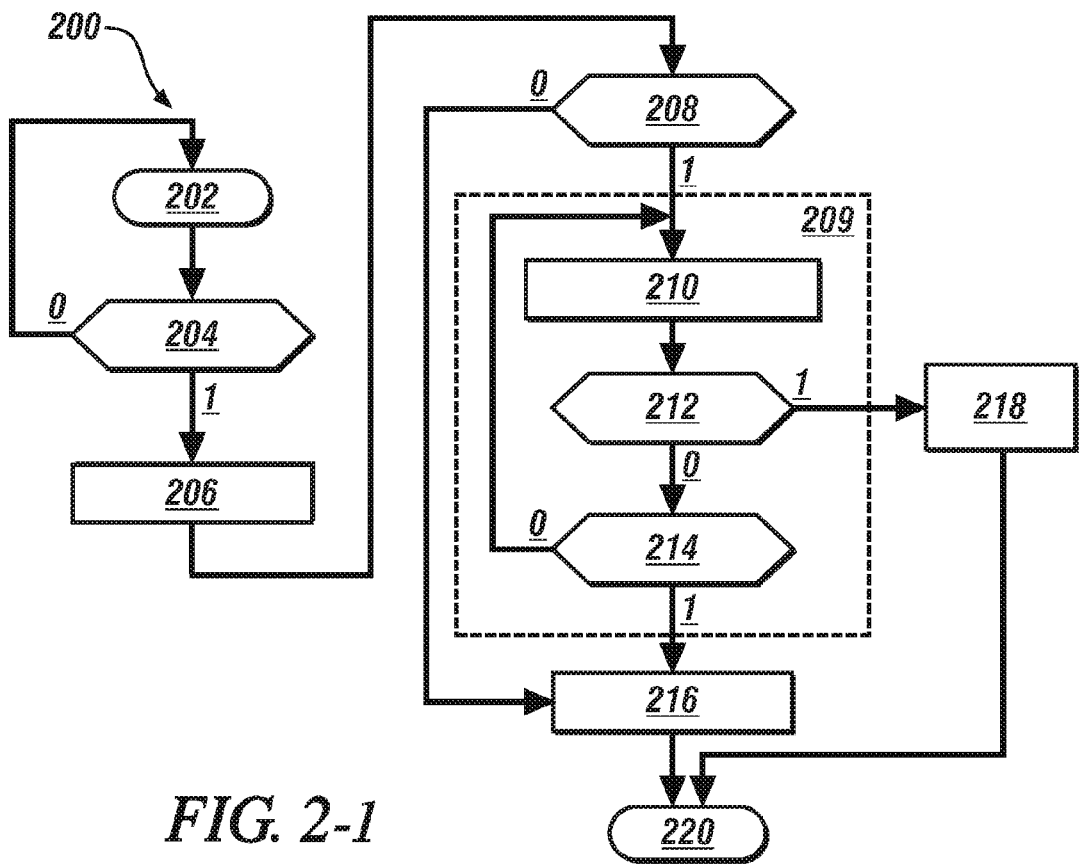
Figure 2:
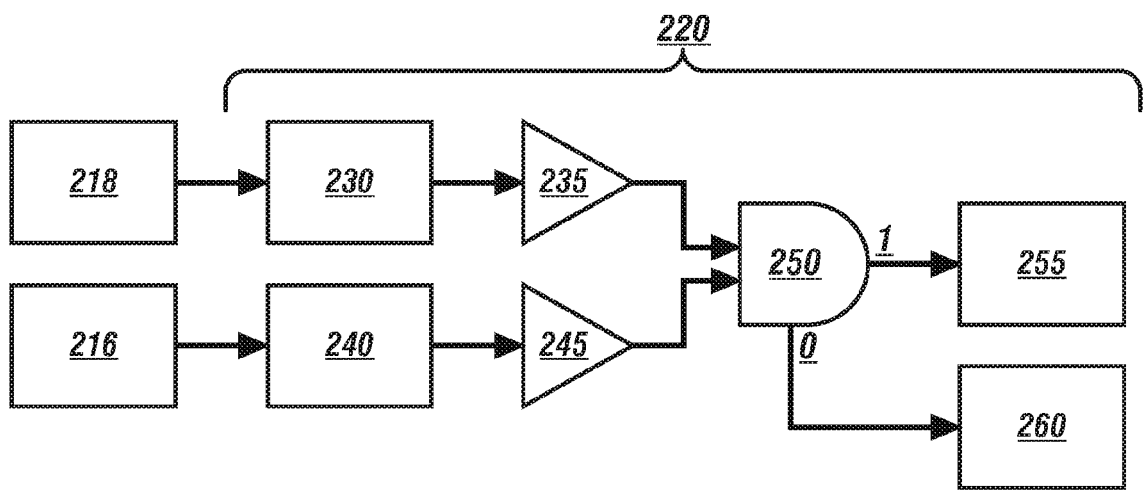

FIG. 2-1 schematically shows a fault validation scheme 200 that is executed as one or more routines and predetermined thresholds to monitor, detect and validate a fault an inverter module for a multi-phase electric motor/generator, e.g., one of the control routines 11 executed in the controller 10 to control the inverter module 20 for the multi-phase electric motor/generator 40 described with reference to FIG. 1. Overall, monitoring the inverter module includes deactivating operation of the inverter module in response to occurrence of a preliminary fault indicated by a hardware-based desaturation diagnostic scheme and monitoring voltage on the high-voltage bus. Occurrence of a true fault can be detected when a change in the voltage on the high-voltage bus is greater than a predetermined threshold. Occurrence of a false fault can be detected when the change in the voltage on the high-voltage bus is less than the threshold. One having ordinary skill in the art will recognize that threshold comparisons include known hysteretic techniques. Table 1 is provided as a key to FIG. 2-1 wherein the numerically labeled blocks and the corresponding functions are set forth as follows.

TABLE 1

| BLOCK | BLOCK CONTENTS |
|---|---|
| 202 | Execute Hardware DSAT diagnostic monitoring |
| 204 | Hardware DSAT diagnostic fault detected? |
| 206 | Start fault validation |
| 208 | Is bus voltage in range? |
| 209 | Validation Loop |
| 210 | $\Delta V = \Delta Vprv + Vdif$ |
| 212 | Threshold not reached? |
| 214 | Window limit reached? Less than threshold? Less than range? |
| 216 | Dip Detected = FALSE Reset $\Delta V$ |
| 218 | Dip Detected = TRUE Reset $\Delta V$ |
| 220 | Execute fault counter scheme |

The fault validation scheme 200 executes during ongoing operation of the multi-phase electric motor/generator 40, e.g., during vehicle key-on when employed on a hybrid vehicle or an electric vehicle. The inverter module executes a hardware DSAT diagnostic scheme to monitor output of internal circuits configured to detect presence of a hardware DSAT fault, preferably by measuring voltage across the collector-emitter junction (Vce) of each of the high-voltage switches (202). Furthermore, voltage across the high-voltage bus (Vbus) is periodically sampled at a high sample rate, e.g., every 0.1 ms in one embodiment, and parameters associated with the voltage, current and operation of the electric circuit for the multi-phase electric motor/generator 40 are monitored. When no hardware-based DSAT fault is detected, the hardware DSAT diagnostic re-executes (204)(0), and there is no further action.

The inverter module detects presence of a hardware-based DSAT fault when Vce is greater than a predefined threshold in any one of the high-voltage switches, and executes an immediate shutdown of the motor/generator 40 for a switch cooling period, e.g., 30 ms in one embodiment, in response to detection of a hardware-based DSAT fault. The hardware-based DSAT fault is considered a preliminary fault that is subject to validation or invalidation as described herein.

When a hardware-based DSAT fault is detected (204)(1), one or more routines associated with the fault validation scheme 200 start and operate concurrently with operation of the motor/generator (206). The control module can execute a shutdown of the inverter module, or alternatively can suspend operation of the inverter module. Furthermore, the fault validation scheme 200 determines whether the voltage across the high-voltage bus (Vbus) of the electric circuit is within an allowable voltage range (208). The allowable voltage range is system-specific and is based upon a nominal voltage of the high-voltage battery employed in the system. An allowable voltage range may be +/−10% of a nominal voltage in one embodiment, and a nominal voltage may be 300V in one embodiment.

When the voltage across the high-voltage bus (Vbus) of the electric circuit is outside the allowable voltage range (208)(0), the fault validation scheme 200 indicates that the preliminary fault detected by the hardware DSAT diagnostic is a false fault for this iteration (FALSE) (216). The total voltage difference ($\Delta V$) is reset to zero, a fault counter scheme executes (220) and operation of the inverter module is restarted. This action prevents occurrence of a fault caused by checking voltage under known deviant conditions, such as during a battery connect/disconnect event.

When the voltage across the high-voltage bus (Vbus) is within the allowable voltage range (208)(1), operation continues with execution of a validation loop 209. The validation loop 209 executes to determine a voltage differential (Vdif), which is a difference between the voltage across the high-voltage bus (Vbus) for a present iteration of the validation loop 209 and the voltage across the high-voltage bus (Vprv) for a previous iteration of the validation loop 209, in accordance with the following relationship.

$$V\text{dif}=V\text{bus}-V\text{prv} \quad [1]$$

A total accumulated voltage difference (ΔV) across the high-voltage bus is calculated (210) as the summation of the total voltage difference for the previous iteration (ΔVprv) and the voltage differential (Vdif), in accordance with the following relationship.

$$\Delta V=\Delta V\text{prv}+V\text{dif} \quad [2]$$

A routine monitoring the voltage differential (Vdif) executes at the sample rate for the voltage measurement across the high-voltage bus (Vbus), (e.g., every 0.1 ms in one embodiment) and the total accumulated voltage difference (ΔV) across the high-voltage bus is determined within a sampling window. The sampling window is preferably less than the switch cooling period. In one embodiment, the sampling window is 20 ms when the switch cooling period is 30 ms. As is appreciated, the total accumulated voltage difference (ΔV) becomes the total voltage difference for the previous iteration (ΔVprv) during the next iteration. The total accumulated voltage difference (ΔV) is an indication of presence (or absence) of a voltage dip across the high-voltage bus (Vbus) that may occur during the sampling window in response to occurrence of a preliminary fault. The total accumulated voltage difference (ΔV) and the voltage differential (Vdif) provide time-based differentials for distinguishing between voltage spikes and other non-fault system anomalies and a true fault.

The total accumulated voltage difference (ΔV) is compared to a voltage threshold (212). When the total accumulated voltage difference (ΔV) is greater than the voltage threshold (212)(1), the fault validation scheme 200 indicates that the preliminary fault detected by the hardware DSAT diagnostic is a true fault (TRUE), thus detecting a voltage dip across the high-voltage bus (Vbus). The validation loop 209 ends, the total accumulated voltage difference (ΔV) is reset to zero (218), and the fault counter scheme executes (220).

When the total voltage difference (ΔV) is less than the voltage threshold (212)(0), it is determined whether the sampling window associated with executions of iterations of the validation loop 209 has elapsed (214). The sampling window represents an elapsed period of time after the hardware DSAT diagnostic detects occurrence of a preliminary fault, is based upon known voltage dip characteristics associated with occurrence of a DSAT fault, and is preferably less than the switch cooling period, e.g., less than 30 ms in one embodiment.

When the sampling window has elapsed without detecting a voltage dip across the high-voltage bus (Vbus), thus achieving a total voltage difference (ΔV) that is greater than the voltage threshold (214)(1), the validation loop 209 ends and the fault validation scheme 200 indicates that the preliminary fault detected by the hardware DSAT diagnostic is a false fault for this iteration (FALSE) (216). The total voltage difference (ΔV) is reset to zero, and operation of the inverter module is restarted. Otherwise this iteration of the validation loop 209 ends (214)(0), and another iteration begins. This operation continues until the sampling window for the validation loop 209 elapses or the total voltage difference (ΔV) is greater than the voltage threshold (212)(1), thus ending operation of the fault validation scheme 200 with execution of the fault counter scheme (220).

FIG. 2-2 schematically shows additional details of an embodiment of the fault validation scheme 200 including execution of the fault counter scheme (220). The fault counter scheme (220) is executed as one or more routines and predetermined calibrated thresholds to validate desaturation (DSAT) faults in one of the power switches of an inverter module for a multi-phase electric motor/generator, e.g., the inverter module 20 for the multi-phase electric motor/generator 40 described with reference to FIG. 1. Table 2 is provided as a key to FIG. 2-2 wherein the numerically labeled blocks and the corresponding functions are set forth as follows.

TABLE 2

| BLOCK | BLOCK CONTENTS |
|-------|----------------|
| 216 | Dip Detected = FALSE<br>Reset ΔV |
| 218 | Dip Detected = TRUE<br>Reset ΔV |
| 220 | Execute Fault Counter Scheme |
| 230 | Increment TRUE fault counter |
| 235 | Compare TRUE fault counter and TRUE fault threshold |
| 240 | Increment FALSE fault counter |
| 245 | Compare FALSE fault counter and FALSE fault threshold |
| 250 | Either<br>TRUE fault counter > TRUE fault threshold?<br>or<br>FALSE fault counter > FALSE fault threshold? |
| 255 | Shutdown system |
| 260 | Wait for switch cooling period and restart |

When a preliminary fault detected by the hardware DSAT diagnostic fails to have a corresponding voltage dip across the high-voltage bus (Vbus), the preliminary fault detected by the hardware DSAT diagnostic is identified as a false fault (FALSE) (216) and a false fault counter is incremented (240). The false fault counter is compared to a FALSE fault count threshold (245), which is preferably a relatively large number. When a preliminary fault detected by the hardware DSAT diagnostic corresponds to a voltage dip across the high-voltage bus (Vbus) (218), the preliminary fault is identified as a true fault (TRUE), and a true fault counter is incremented (230). The true fault counter is compared to a TRUE fault count threshold (235), which is preferably a relatively small number, e.g., two or three. When the true fault counter is greater than the TRUE fault count threshold (250)(1), an inverter module fault is validated and a system shutdown is executed (255). Similarly, when the false fault counter is greater than the FALSE fault count threshold (250)(1), an inverter module fault is validated is validated and a system shutdown is executed (255). The system shutdown includes disabling operation of the inverter module and thus disabling operation of the multi-phase electric motor/generator. When both the false fault counter is less than the FALSE fault count threshold and the true fault counter is less than the TRUE fault count threshold (250)(0), no inverter module fault is validated and operation of the inverter module for the multi-phase electric motor/generator is disabled for a predetermined switch cooling period, e.g., less than 30 ms, and then restarted (260). The portion of the operation that includes the false fault counter and the FALSE fault count threshold is based upon an understanding that repeated occurrences of false faults indicates that some form of undetected fault is present in the system that is causing the conditions leading to the false fault detection.

Figure 3:
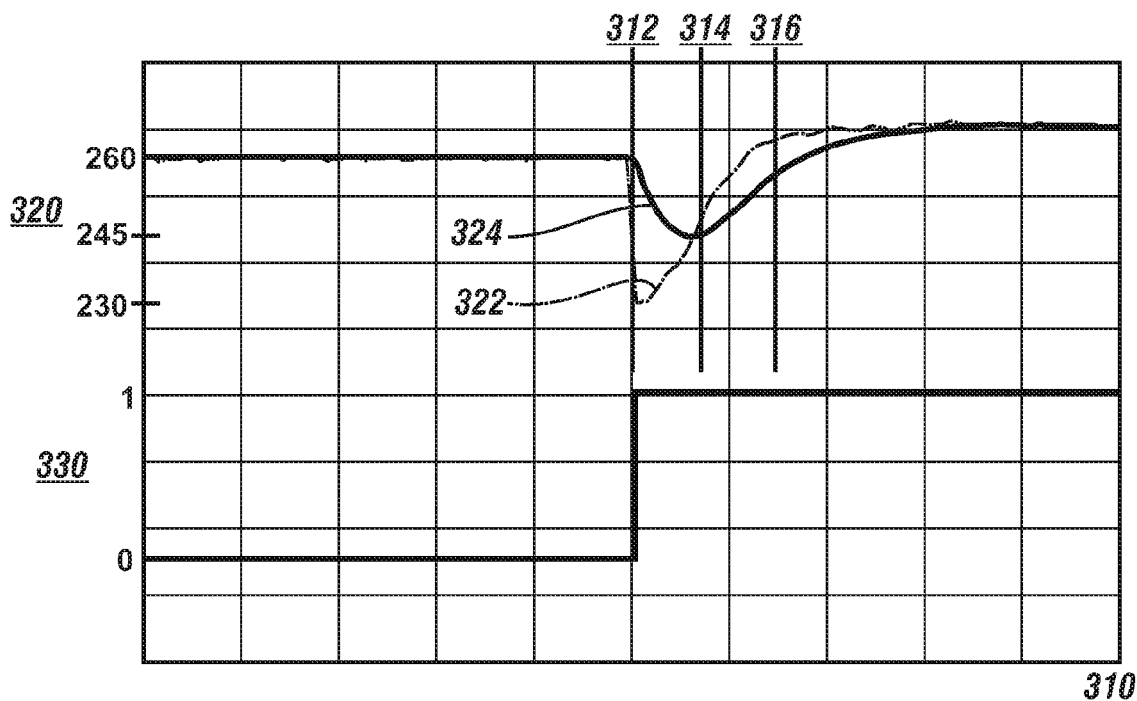
FIG. 3 illustrates the effect of occurrence of a true DSAT fault upon high-voltage bus voltage, in accordance with the disclosure.

FIG. 3 graphically shows high-voltage bus voltage 320 and a DSAT fault indicator 330 in relation to time shown on the horizontal axis 310, and depicts the effect of occurrence of a true DSAT fault upon the high-voltage bus voltage 320. The high-voltage bus voltage 320 includes a raw bus voltage 322 and a filtered bus voltage 324. Initially, the raw bus voltage 322 is at a normal level, indicated at about 260 Vdc and the DSAT hardware fault indicator 330 is at a 0 value, indicating absence of a preliminary DSAT hardware fault. At time 312, the DSAT hardware fault indicator 330 indicates a preliminary DSAT hardware fault by transitioning to a value of 1. A sampling window of 20 ms is depicted between time 312 and time 316. The raw bus voltage 322 responds immediately to the indicated DSAT fault with a drop in magnitude to about 230 Vdc, and begins to recover as the control scheme deactivates the inverter module to eliminate the effects of the indicated DSAT fault. The filtered bus voltage 324 decreases, albeit at a reduced rate, achieving a minimum voltage of about 245 Vdc at time 314, which occurs at about 12 ms after occurrence of the indicated DSAT hardware fault at time 312. Thus, the time rate change in voltage dV/dT is about −1333 V/Sec. The data indicates that occurrence of a true DSAT fault has a corresponding measurable effect upon raw bus voltage 322 and filtered bus voltage 324. A hard shutdown of the inverter module occurs in response to the fault validation.

Figure 4:
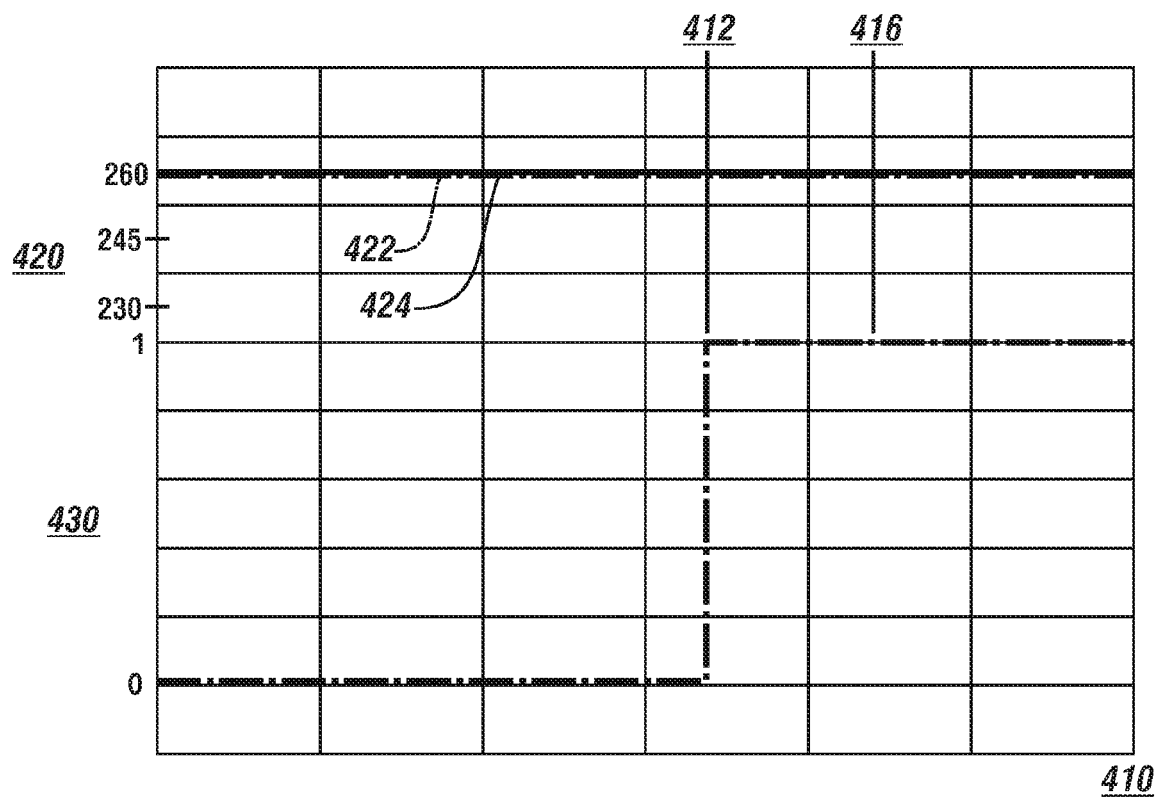
FIG. 4 illustrates the effect of occurrence of a false DSAT fault upon high-voltage bus voltage, in accordance with the disclosure.

FIG. 4 graphically shows signals including a high-voltage bus voltage 420 and a DSAT fault indicator 430 in relation to time shown on the horizontal axis 410, and depicts the effect of occurrence of a false DSAT fault upon the high-voltage bus voltage 420. The high-voltage bus voltage 420 includes a raw bus voltage 422 and a filtered bus voltage 424. Initially, the raw bus voltage 422 is at a normal level, indicated at about 260 Vdc and the DSAT hardware fault indicator 430 is at a 0 value, indicating absence of a DSAT hardware fault. At time 412, the DSAT hardware fault indicator 430 indicates a preliminary DSAT hardware fault by transitioning to a value of 1, albeit a false fault caused by other factors, e.g., hardware circuitry production tolerance variations or EMI variances. A sampling window of 20 ms is depicted between time 412 and time 416. The raw bus voltage 422 and the filtered bus voltage 424 fail to respond to the indicated DSAT hardware fault. Thus, the false fault can be eliminated without causing an unneeded system shutdown. When a false fault occurs, the system can respond by executing a retry wherein the system shuts down, waits during a switch cooling period, e.g., 30 ms, for heat to dissipate from the switches, and executes a circuit reset and goes back on-line.

The voltage characteristics associated with true faults and false faults shown in FIGS. 3 and 4 are developed and employed in an embodiment of the fault validation scheme 200 described with reference to FIGS. 2-1 and 2-2 to monitor, detect and validate a fault an inverter module for a multi-phase electric motor/generator, e.g., the inverter module 20 for the multi-phase electric motor/generator 40 described with reference to FIG. 1.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for monitoring an inverter module for a multi-phase electric motor/generator, comprising:
in response to occurrence of a preliminary fault in the inverter module indicated by a hardware-based desaturation diagnostic scheme:
deactivating operation of the inverter module;
monitoring voltage on a high-voltage bus configured to supply electric power to the inverter module;
detecting occurrence of a true fault when a change in the voltage on the high-voltage bus is greater than a predetermined threshold; and
detecting occurrence of a false fault when the change in the voltage on the high-voltage bus is less than the predetermined threshold.

2. The method of claim 1, wherein detecting the occurrence of a true fault when a change in the voltage on the high-voltage bus is greater than the predetermined threshold comprises detecting the occurrence of a true fault when a change in the voltage on the high-voltage bus is greater than said predetermined threshold during a sampling window.

3. The method of claim 2,
wherein monitoring voltage on the high-voltage bus comprises monitoring a time-based voltage differential across the high-voltage bus during the sampling window; and
wherein detecting occurrence of the false fault comprises detecting the occurrence of the false fault when the time-based voltage differential is less than said predetermined threshold.

4. The method of claim 2,
wherein monitoring voltage on the high-voltage bus comprises monitoring a time-based voltage differential across the high-voltage bus during the sampling window; and
wherein detecting occurrence of the true fault comprises detecting the occurrence of the true fault when the time-based voltage differential is greater than said predetermined threshold.

5. The method of claim 1, further comprising:
executing a true fault counter to count occurrences of true faults;
validating an inverter module fault when the true fault counter is greater than a predetermined true fault count; and
disabling operation of the inverter module and disabling operation of the multi-phase electric motor/generator when the inverter module fault is validated.

6. The method of claim 1, further comprising:
executing a false fault counter to count occurrences of false faults;
validating an inverter module fault when the false fault counter is greater than a predetermined false fault count; and
disabling operation of the inverter module and disabling operation of the multi-phase electric motor/generator when the inverter module fault is validated.

7. The method of claim 1, wherein deactivating operation of the inverter module comprises disabling operation of the inverter module for a predetermined switch cooling period.

8. The method of claim 1, further comprising reactivating operation of the inverter module after a predetermined switch cooling period.

9. The method of claim 1, further comprising:
executing a true fault counter to count occurrences of true faults and executing a false fault counter to count occurrences of false faults;

validating an inverter module fault when the true fault counter is greater than a predetermined true fault count; and disabling operation of the inverter module and disabling operation of the multi-phase electric motor/generator when the inverter module fault is validated.

10. The method of claim 9, further comprising validating the inverter module fault when the false fault counter is greater than a predetermined false fault count.

11. Method for monitoring an electric motor/generator, comprising:

detecting a preliminary fault associated with an inverter module controlling the electric motor/generator based upon a hardware-based desaturation diagnostic scheme monitoring high-voltage switches of the inverter module; and subsequent to detecting a preliminary fault:
   deactivating operation of the inverter module for a predetermined switch cooling period and monitoring voltage on a high-voltage bus supplying electric power to the inverter module; and
   detecting an occurrence of a true fault when a change in the voltage on the high-voltage bus is greater than a predetermined threshold during the switch cooling period.

12. The method of claim 11, wherein detecting the occurrence of the true fault comprises detecting the occurrence of the true fault when the change in the voltage on the high-voltage bus is greater than said predetermined threshold during a predetermined sampling window.

13. The method of claim 11:
wherein monitoring voltage on the high-voltage bus comprises monitoring a time-based voltage differential across the high-voltage bus; and
wherein detecting the occurrence of the true fault comprises detecting the occurrence of the true fault when the time-based voltage differential is greater than said predetermined threshold.

14. The method of claim 11, further comprising:
subsequent to detecting a preliminary fault:
   detecting an occurrence of a false fault when the change in the voltage on the high-voltage bus is less than said predetermined threshold during the switch cooling period.

15. The method of claim 14, further comprising:
executing a false fault counter to count occurrences of false faults;
validating an inverter module fault when the false fault counter is greater than a predetermined false fault count; and
disabling operation of the inverter module and disabling operation of the multi-phase electric motor/generator when the inverter module fault is validated.

16. The method of claim 11, further comprising:
executing a true fault counter to count the occurrences of the true faults; and
validating an inverter module fault when the true fault counter is greater than a predetermined true fault count; and
disabling operation of the inverter module and disabling operation of the multi-phase electric motor/generator when the inverter module fault is validated.

17. Method for monitoring an inverter module for a multi-phase electric motor/generator configured to generate tractive torque for a vehicle, comprising:

deactivating the inverter module for a predetermined switch cooling period in response to an occurrence of a preliminary fault indicated by a hardware-based desaturation diagnostic scheme;

subsequent to deactivating the inverter module:
   monitoring voltage on a high-voltage bus supplying electric power to the inverter module;
   detecting occurrences of true faults when a change in the voltage on the high-voltage bus is greater than a predetermined threshold;

executing a fault counter to count the occurrences of true faults;

validating an inverter module fault when the fault counter exceeds a predetermined fault count; and executing a shutdown to disable operation of the multi-phase electric motor/generator when the inverter module fault is validated.

\* \* \* \* \*